(12) United States Patent
Tesauro

(10) Patent No.: US 6,752,900 B2
(45) Date of Patent: Jun. 22, 2004

(54) VACUUM LOADLOCK ULTRAVIOLET BAKE FOR PLASMA ETCH

(75) Inventor: Mark R. Tesauro, Fountain Hills, AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/969,197

(22) Filed: Oct. 2, 2001

(65) Prior Publication Data

US 2002/0046809 A1 Apr. 25, 2002

Related U.S. Application Data

(62) Division of application No. 09/300,095, filed on Apr. 27, 1999, now Pat. No. 6,339,028.

(51) Int. Cl.[7] .......................... H05H 1/00; C23C 16/00; H01L 21/00
(52) U.S. Cl. .............................. 156/345.31; 156/345.5; 156/345.32; 118/719; 118/722; 438/708
(58) Field of Search .................................. 118/719, 722, 118/718, 715; 156/345.31, 345.5, 345.32; 438/708, 709, 706, 725; 216/41, 62, 67

(56) References Cited

U.S. PATENT DOCUMENTS

| | | | |
|---|---|---|---|
| 4,699,689 A | 10/1987 | Bersin | 156/643 |
| 5,110,394 A | 5/1992 | Ogawa | 156/345 |
| 5,198,388 A | 3/1993 | Kawai | 437/173 |
| 5,240,556 A | 8/1993 | Ishikawa et al. | 156/643 |
| 5,288,684 A | 2/1994 | Yamazaki et al. | 118/722 |
| 5,314,541 A * | 5/1994 | Saito et al. | 118/725 |
| 5,344,522 A | 9/1994 | Yagi et al. | 156/628 |
| 5,527,417 A | 6/1996 | Iida et al. | 156/345 |
| 5,658,418 A | 8/1997 | Coronel et al. | |
| 6,467,491 B1 * | 10/2002 | Sugiura et al. | 134/1.3 |

FOREIGN PATENT DOCUMENTS

JP 3-66126 A * 3/1991 .......... H01L/21/316

* cited by examiner

Primary Examiner—Parvis Hassanzadeh
(74) Attorney, Agent, or Firm—Lisa K. Jorgenson; William A. Munck

(57) ABSTRACT

An improved vacuum plasma etching device for plasma etching semiconductor wafers that have a photo-resist pattern. The improved plasma etching device has a reaction chamber in which the plasma etching is performed during a process cycle, an entrance vacuum loadlock for holding the next semiconductor wafer to be plasma etched, an exit vacuum loadlock for transporting the semiconductor wafers out of the reaction chamber after the plasma etching process, and a source of ultraviolet light. Exposing the semiconductor wafer to the ultraviolet light cures the photo-resist patterns, thereby improving CD dispersion, enhancing pattern transfer, and preventing photo-resist reticulation. Curing the photo-resist patterns while the semiconductor wafer is being held during the process cycle in the entrance vacuum loadlock, increases efficiency and productivity.

19 Claims, 3 Drawing Sheets

VACUUM LOADLOCK ULTRAVIOLET BAKE FOR PLASMA ETCH

This application is a division of prior U.S. patent application Ser. No. 09/300,095 filed on Apr. 27, 1999 now U.S. Pat. No. 6,339,028.

BACKGROUND ART

1. Field of the Invention

The present invention relates to vacuum plasma etching devices in which semiconductor wafers having photo-resist patterns are exposed to a vacuum plasma etching process to etch integrated circuits ("IC") into the semiconductor wafers. More particularly, the present invention relates to a vacuum plasma etching device and a method for curing the photo-resist patterns with an ultraviolet bake prior to the plasma etching process to improve CD dispersion, enhance pattern transfer, and prevent photo-resist reticulation.

2. Description of Related Art

Vacuum plasma etching systems and devices for etching high-density IC's onto semiconductor wafers prepared with a photo-resist pattern are well known in the art. These semiconductor wafers, or substrates, are typically made of silicon. It is common to dispose a layer of metallic material on top of the semiconductor wafer, into which various elements, such as interconnect lines, holes for vertical interconnect lines, vias, and contacts are lithographically transferred. These interconnecting elements are etched to form the components of the desired IC, such as transistors. The photo-resist patterns define where the plasma will etch away the metallic films.

A typical example of a vacuum plasma etching device is the poly etch device sold by Lam Research of Fremont, Calif., under model number 4420. In such a device, an individual semiconductor wafer is taken from a loading cassette of unetched semiconductor wafers, fed into an entrance vacuum loadlock that is pumped down to a vacuum, passed into a vacuum reaction chamber where the plasma etching process takes place, passed into an exit vacuum loadlock where the vacuum is released, and then fed into a finished cassette of etched semiconductor wafers. Although the total elapsed time, from taking an unetched semiconductor wafer out of the loading cassette to placing the etched semiconductor wafer into the finished cassette, varies, the time required for the plasma etching process within the vacuum reaction chamber usually takes more than 60 seconds. Thus, there is a process cycle of at least 60 seconds. During this process cycle the next semiconductor wafer to be etched is held within the entrance vacuum loadlock. Although a portion of this time is used to pump the entrance loadlock down to a vacuum, for the majority of the process cycle, the semiconductor wafer sits idly in a vacuum in the entrance vacuum loadlock.

Prior to performing the plasma etching process on the semiconductor wafers, it is desirable to expose the semiconductor wafers to ultraviolet light to "cure" the photo-resist pattern. Normally, this is done in a separate device than the vacuum plasma etching device. This ultraviolet curing process makes the resist pattern more resistant to the plasma etch and helps preserve the pattern integrity during the plasma etching process. The presence of a vacuum during this curing process helps to remove volatile substances present in the photo-resist, thereby further "hardening" the photo-resist against the plasma etching process. Curing the photo-resist pattern with ultraviolet light improves CD dispersion, enhances pattern transfer, and prevents photo-resist reticulation.

Despite these advances in the art, there is a need for a plasma etching device that increases efficiency, increases productivity, improves CD dispersion, enhances pattern transfer, and prevents photo-resist reticulation. There is a need for an improved plasma etching device that not only performs a vacuum plasma etching process on a semiconductor wafer, but which can also perform an ultraviolet bake on the semiconductor wafer prior to the plasma etching process to cure the photo-resist pattern on the semiconductor wafer.

BRIEF SUMMARY OF THE INVENTION

A principle advantage of the present invention is that the unused time in which a semiconductor wafer is held within a vacuum plasma etching tool loadlock prior to being plasma etched can be efficiently used to cure the photo-resist pattern on the semiconductor wafer by selectively exposing the photo-resist pattern to ultraviolet light. The device and method of the present invention exposes the photo-resist pattern to ultraviolet light and cures the photo-resist pattern, thereby improving CD dispersion, enhancing pattern transfer, and preventing photoresist reticulation.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
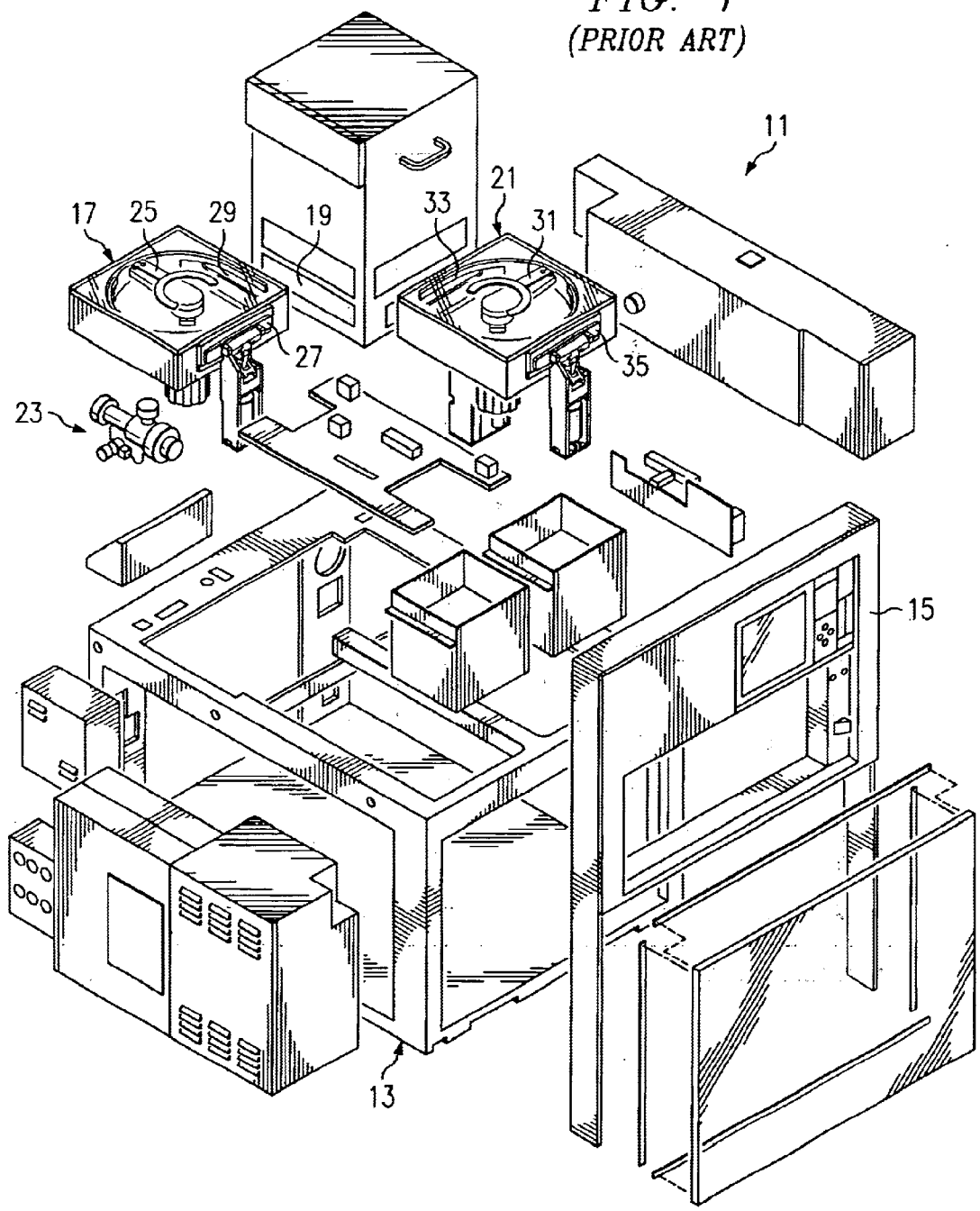
FIG. 1 is an exploded view of a prior-art vacuum plasma etching device.

Referring, to FIG. 1 in the drawings, a prior-art vacuum plasma etching device 11 for etching individual semiconductor wafers is illustrated in an exploded view. Vacuum plasma etching device 11 is supported by a frame 13. A user interface panel 15 for data input and operational monitoring is carried by frame 13. Vacuum plasma etching device 11 includes various other components, including: power sources and regulators, cassettes for holding and transporting multiple semiconductor wafers, elevator assemblies for moving individual semiconductor wafers, IC boards for connecting and controlling the various components, temperature control mechanisms for maintaining appropriate operating temperatures, sealing devices for maintaining appropriate pressure levels, and pumping mechanisms for producing vacuums in certain chambers.

Of particular importance in prior-art vacuum plasma etching device 11 are vacuum loadlock, or entrance loadlock 17, reaction chamber 19, vacuum loadlock, or exit loadlock 21, and vacuum pump 23. Entrance loadlock 17 is coupled to frame 13 and is adapted to receive an individual, pre-process semiconductor wafer, or simply, pre-process wafer 18, having an upper surface 18a and a lower surface 18b (see FIG. 3). Upper surface 18a contains a photo-resist pattern (not shown) for defining material that will be etched away during a plasma etching process. Exit loadlock 21 is coupled to frame 13 and adapted to receive an individual, post-process semiconductor wafer, or simply, post-process wafer (not shown). Entrance loadlock 17 and exit loadlock 21 are both in fluid communication with reaction chamber 19, such that pre-process wafers 18 may be moved from entrance loadlock 17 to reaction chamber 19, and that the post-process wafers may be moved from reaction chamber 19 to exit loadlock 21. Vacuum pump 23 is carried by frame 13, and is a pressure regulating device. Vacuum pump 23, either alone or in conjunction with similar such devices, provides and maintains a vacuum over a selected period of time in at least entrance loadlock 17, reaction chamber 19, and exit loadlock 21.

Entrance loadlock 17 typically includes an entrance actuating member 25 for precisely grasping, holding, and moving pre-process wafers 18. Entrance actuating member 25 is usually a pivoting armature located within entrance loadlock 17. Entrance actuating member 25 is adapted to pivot and extend outside of entrance loadlock 17, either through a first opening 27 to grasp pre-process wafer 18 and move it into entrance loadlock 17, or through a second opening 29 to move pre-process wafer 18 out of entrance loadlock 17 and into vacuum reaction chamber 19. Entrance loadlock 17 is in fluid communication with vacuum pump 23, or other similar devices. Thus, entrance loadlock 17 provides a pressure controlled environment necessary for a transition from atmospheric pressure to a vacuum, or vice versa.

In a similar fashion, exit loadlock 21 typically includes an exit actuating member 31 for precisely grasping, holding, and moving post-process wafers. Exit actuating member 31 is usually a pivoting armature located within exit loadlock 21. Exit actuating member 31 is adapted to pivot and extend outside of exit loadlock 21 either through a first opening 33 to grasp and remove the post-process wafer from within reaction chamber 19 and move it into exit loadlock 21, or through a second opening 35 to move the post-process wafer out of exit loadlock 21 for further processing. Exit loadlock 21 is in fluid communication with vacuum pump 23, or other similar devices. Thus, exit loadlock 21 provides a pressure controlled environment necessary for a transition from atmospheric pressure to a vacuum, or vice versa.

Reaction chamber 19 is a vacuum chamber in which the plasma etching process takes place. The plasma etching process may involve the application of one or more chemical etchants and production of a plasma state in one or more steps. Various gaseous media are used to perform the etching, depending upon the semiconductor material being etched, the desired etched profile, and the desired etching rate. In any event, it is generally desirable that a vacuum is maintained within reaction chamber 19 at all times during the plasma etching process.

Continuing with reference to FIG. 1 in the drawings, operation of prior-art vacuum plasma etching device 11 will now be discussed. First, a cassette (not shown) holding a plurality of semiconductor wafers is loaded into vacuum plasma etching device 11 by a user (not shown). First opening 27 of entrance loadlock 17 is opened to the atmosphere so that entrance actuating member 25 may pivot and extend outside of entrance loadlock 17 to grasp pre-process wafer 18 from the cassette of semiconductor wafers, or some other wafer transport device. While entrance loadlock 17 is opened to the atmosphere, the pressure within entrance loadlock 17 is at atmospheric pressure, or the pressure within vacuum plasma etching device 11, as would be the case if vacuum plasma etching device 11 is pressure sealed.

Entrance actuating member 25 grasps pre-process wafer 18 and moves it to a precise location within entrance loadlock 17. Once pre-process wafer 18 has been moved into entrance loadlock 17, first opening 27 of entrance loadlock 17 is closed and sealed shut. Once pre-process wafer 18 is sealed within entrance loadlock 17, vacuum pump 23 begins a pump-down process in which air and other gas is pumped out of entrance loadlock 17 until a vacuum is created within entrance loadlock 17.

Pre-process wafer 18 is held in the entrance loadlock for a predetermined amount of time, or a "loadlock hold period," typically at least sixty seconds, until reaction chamber 19 is ready to receive pre-process wafer 18. When reaction chamber is ready to receive pre-process wafer 18, reaction chamber 19 is opened to entrance loadlock 17. Then, entrance actuating member 25 moves pre-process wafer 18 from within entrance loadlock 17 to a precise location within reaction chamber 19. Once pre-process wafer 18 has been properly located within reaction chamber 19, entrance actuating member 25 retracts out of reaction chamber 19, and reaction chamber 19 is closed to entrance loadlock 17. It is preferred that pre-process wafer 18 is passed from entrance loadlock 17 into reaction chamber 19 at a controlled, sub-atmospheric pressure.

Once pre-process wafer 18 is properly located within reaction chamber 19, pre-process wafer 18 undergoes the plasma etching process. As explained above, the plasma etching process may involve multiple stages using multiple gaseous etchants. As mentioned above, the etching process has a predetermined process cycle, and is performed over a predetermined process cycle time, usually at least sixty seconds. During or near the end of the process cycle, exit loadlock 21 is closed to the atmosphere, and a vacuum is created within exit loadlock 21 by vacuum pump 23, or a similar pressure control or gas-evacuation device. At the conclusion of the plasma etching process, pre-process wafer 18 has become an etched, post-process wafer. Reaction chamber 19 is then opened to exit loadlock 21, so that exit actuating member 31 may pivot and extend through first opening 33 into reaction chamber 19. Exit actuating member 31 grasps the post-process wafer and moves it from reaction chamber 19 to a precise location within exit loadlock 21. Once the post-process wafer and exit actuating member 31 are removed from reaction chamber 19, reaction chamber 19 is closed to exit loadlock 21.

After exit loadlock 21 has been closed and sealed, the vacuum within exit loadlock 21 is released and the pressure within exit loadlock 21 is adjusted by vacuum pump 23 to a selected level, usually either atmospheric pressure, or the pressure within vacuum plasma etching device 11. Once exit loadlock 21 is opened to the atmosphere, exit actuating member 31 moves the post-process wafer out of exit loadlock 21 and places the post-process wafer in a cassette (not shown) for holding a plurality of post-process wafers for further processing, or collection by the user. Finally, exit actuating member 31 is retracted back within exit loadlock 21 and exit loadlock 21 is again closed to the atmosphere.

Although the above description is an abbreviation of the entire process for plasma etching a semiconductor wafer with vacuum plasma etching device 11, it will be apparent that the process cycle defined above is sufficient for purposes of the present invention. The steps described in the process cycle defined above, particularly the steps of creating and maintaining vacuums within entrance loadlock 17 and exit loadlock 19, generally occur while a semiconductor wafer is being plasma etched within reaction chamber 19. Of particular importance is the predetermined period of time pre-process wafer 18 is held idly in a vacuum within entrance loadlock 17. For purposes of the present invention, this predetermined period of time will be referred to as the "loadlock idle period." It should be understood that the entire vacuum plasma etching process is controlled by microprocessors and other control circuitry.

Figure 2:
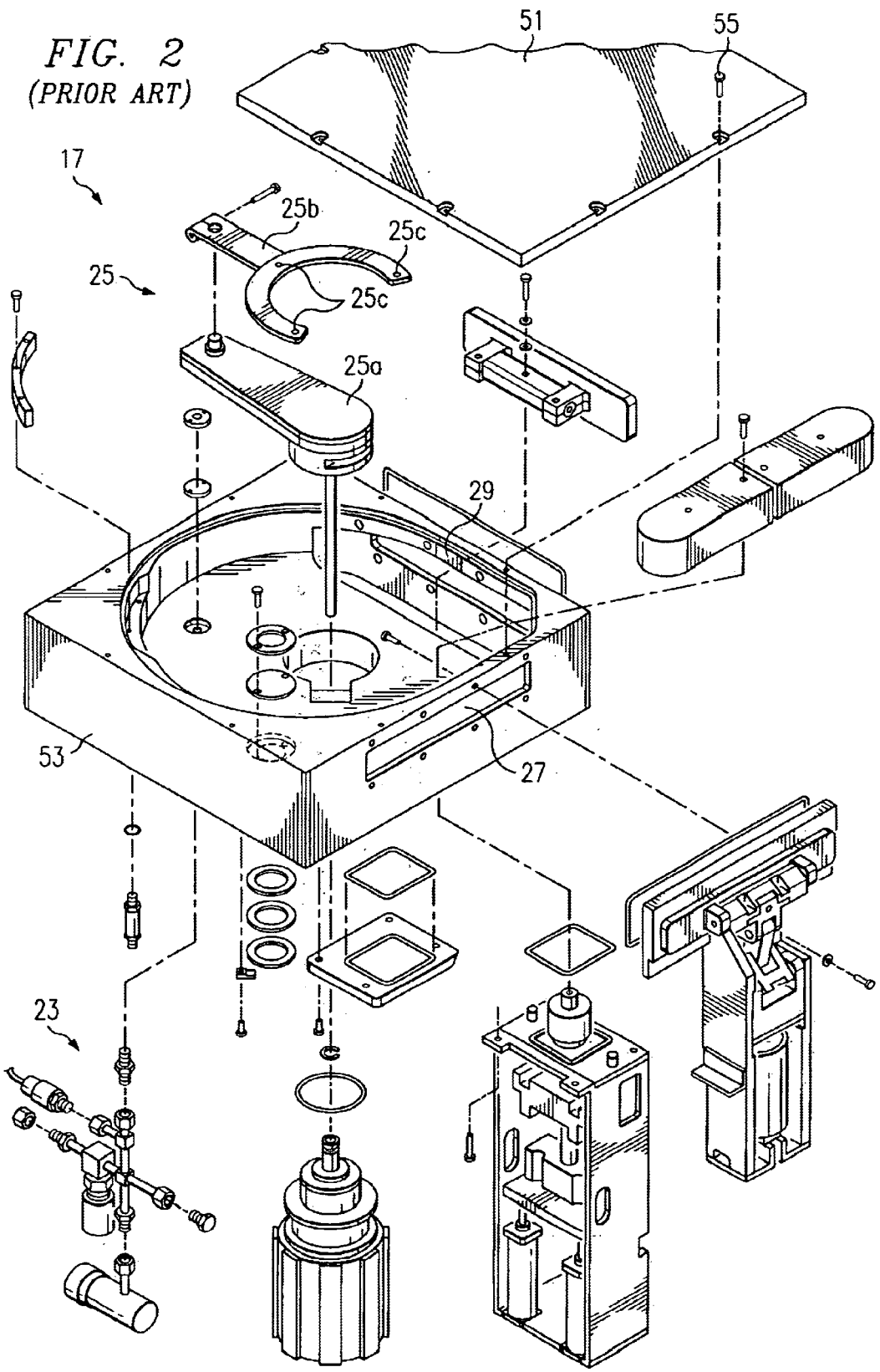
FIG. 2 is an exploded view of a prior-art vacuum loadlock for the prior-art vacuum plasma etching device of FIG. 1.

Referring now to FIG. 2 in the drawings, prior-art entrance loadlock 17 is illustrated in an exploded perspective view. Entrance actuating member 25 is shown to include a rotating base portion 25a and a horseshoe-shaped portion 25b that pivots about an end of base portion 25a. Horseshoe-shaped portion 25b includes conventional means 25c for grasping, holding, and precisely locating pre-process wafers 18. It is important to note that entrance actuating member 25 is adapted to grasp pre-process wafer 18 from an underneath side, such that an entire upper surface of pre-process wafer 18 is unobstructed. As is shown, first opening 27 and second opening 29 are located 90° apart on adjacent sides of entrance loadlock 17. It should be understood that entrance loadlock 17 may have openings disposed at various locations on entrance loadlock 17 without affecting the operation of the present invention. As is shown, entrance loadlock 17 includes many components: mechanisms for opening, closing, and sealing first opening 27 and second opening 29, mechanisms for actuating entrance actuating member 25, and coupling devices for coupling vacuum pump 23 to entrance loadlock 17. Of particular importance is cover 51. Cover 51 is typically made of a sheet of rigid plastic and is releasably fastened to a body portion 5 of entrance loadlock 17 by fastening means 55, typically a plurality of screws. It is necessary that cover 51 be made of a material rigid enough to withstand the vacuum created within entrance loadlock 17. Cover 51 of prior-art entrance loadlock 17 is generally transparent and serves to sealingly enclose entrance loadlock 17. Cover 51 is transparent so that a user may observe and diagnose handling problems without opening loadlock 17.

Figure 3:
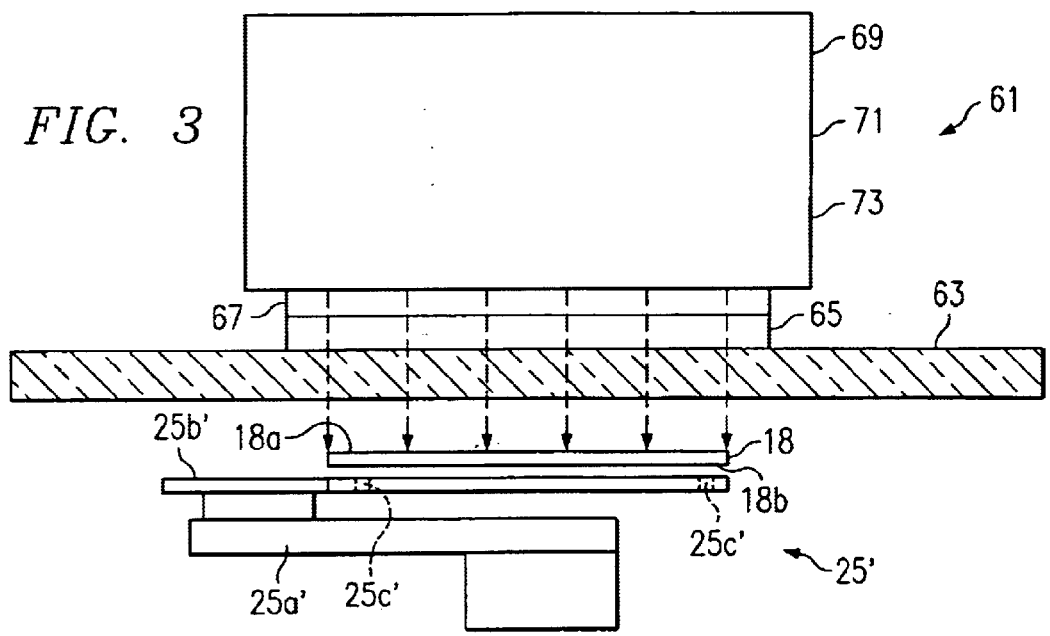
FIG. 3 is a side view of a vacuum loadlock of an improved vacuum plasma etching device according to the present invention.
Figure 4:
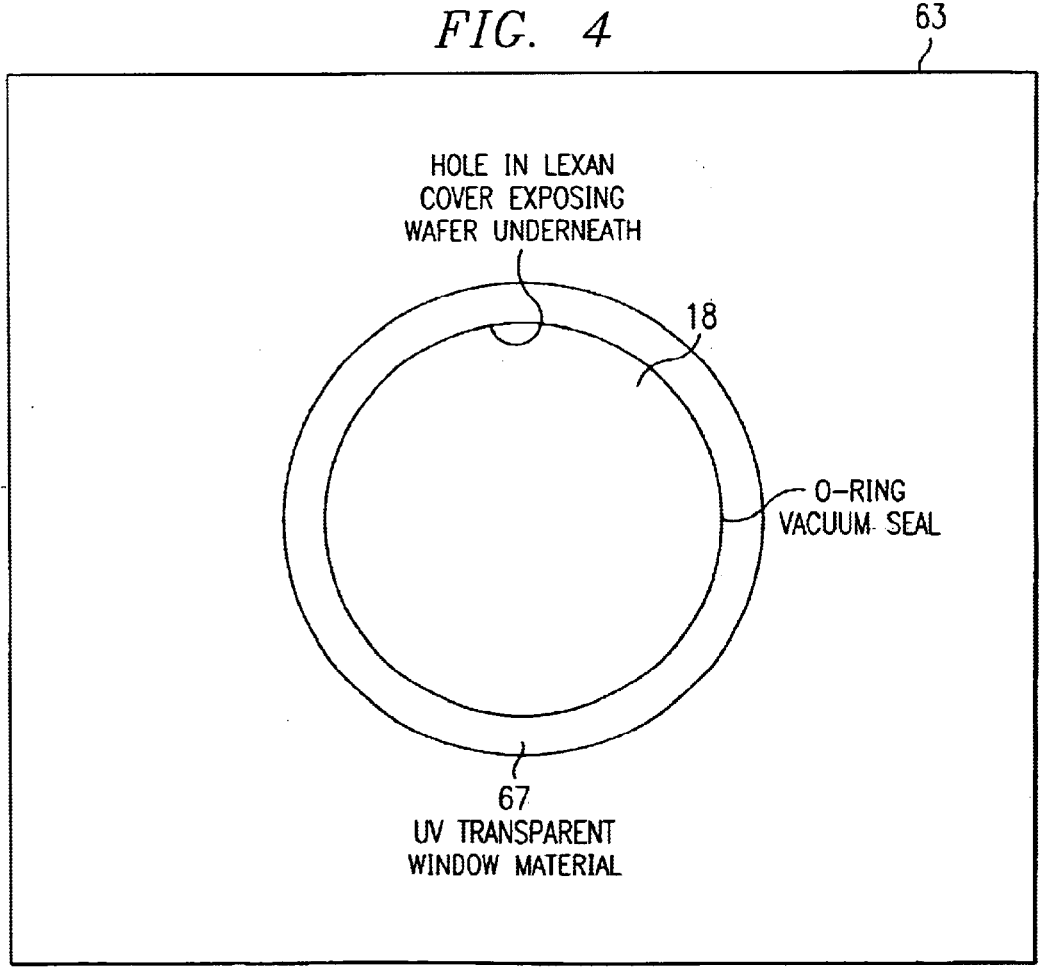
FIG. 4 is a top view of the vacuum loadlock of FIG. 3.

Referring now to FIGS. 3 and 4 in the drawings, an improved vacuum loadlock 61 according to the present invention is illustrated. A typical use for vacuum loadlock 61 would be as a substitute for entrance loadlock 17 in vacuum plasma etching device 11 described above. As is shown, cover 51 has been replaced by a cover 63, preferably a lexan cover. Cover 63 includes an annular aperture 64, preferably concentric about pre-process wafer 18. An annular collar 65 is sealingly coupled to cover 63. A window member 67 is sealingly coupled to collar 65, preferably by an O-ring. Collar 65 may provide additional means of adapting and sealingly coupling window member 67 cover 63. Window member 67 is preferably made of a material that is transparent to ultraviolet light, such as quartz or sapphire. It should be understood that other ultraviolet-transparent materials may be used. Further, it should be understood that entire cover 63 may be made of such ultraviolet-transparent material; however, due to economic considerations, the use of window member 67 is preferred. Vacuum loadlock 61 may have a plurality of openings through which wafers are moved, and that the openings may be located at various locations around vacuum loadlock 61 without affecting the operation of vacuum loadlock 61.

A lamp housing 69 is carried by vacuum loadlock 61. Lamp housing 69 includes a source of ultraviolet light 71, such as an ultraviolet lamp. Source of ultraviolet light 71 may be either a lamp array or an optical assembly of lenses. The primary purpose of source of ultraviolet light 71 is to produce a relatively uniform illumination or heating of pre-process wafer 18, particularly the photo-resist pattern on upper surface 18a. Lamp housing 69 and source of ultraviolet lamp 71 are configured such that rays of ultraviolet light 73 pass through lamp housing 69, window member 67, collar 65, aperture 64, and cover 63, thereby impinging upon upper surface 18a of pre-process wafer 18 containing the photo-resist pattern. Pre-process wafer 18 is held within vacuum loadlock 61 by an entrance actuating arm 25'. Entrance actuating arm 25' is very similar in form and function as prior-art entrance actuating arm 25. Thus, entrance actuating arm 25' includes a rotating base portion 25a' and a horseshoe-shaped portion 25b' that pivots about an end of base portion 25a'. Horseshoe-shaped portion 25b' includes conventional means 25c' for grasping, holding, and precisely locating pre-process wafers 18. It is important to note that entrance actuating member 25' is adapted to grasp pre-process wafer 18 from lower surface 18b, such that an entire upper surface 18a of pre-process wafer 18 is unobstructed. As mentioned above, the photo-resist pattern is contained in upper surface 18a.

The improved vacuum plasma etching device according to the present invention, including vacuum loadlock 61, is operated in the same general manner described above for the prior-art vacuum plasma etching device 11 shown in FIG. 1. The primary difference in the operation of prior-art vacuum plasma etching device 11 and the improved vacuum plasma etching device of the present invention, is that the present invention includes source of ultraviolet light 71. By adding source of ultraviolet light 71 to vacuum loadlock 61, the vacuum plasma etching device of the present invention is capable of performing an additional operation of selectively exposing pre-process wafer 18 to an ultraviolet bake in which the photo-resist is hardened, or cured. This ultraviolet-light curing process makes the photo-resist pattern more resistant to the plasma etch and helps preserve the pattern integrity during the plasma etching process. The control parameters of source of ultraviolet light 71, such as turning on, duration of staying on, intensity of the ultraviolet light, and turning off, are preferably integrated into user interface panel 15.

The presence of a vacuum during the ultraviolet curing process helps to remove volatile substances present in the photo-resist, thereby further hardening the photo-resist against the plasma etching process. Curing the photo-resist pattern with ultraviolet light improves CD dispersion, enhances pattern transfer, and prevents photo-resist reticulation. The ultraviolet-light curing process preferably consists of selectively exposing the photo-resist pattern to ultraviolet light at a selected intensity for a selected period of time, or "exposure period," to produce the desired level of photo resist cross linking. It is desirable that the exposure period be less than or equal to the loadlock idle period. Because this curing process should be performed prior to the plasma etching process, it is preferred that the curing process take place during the loadlock idle period while pre-process wafer 18 is held in a vacuum within vacuum loadlock 61. In addition, it is advantageous to perform the ultraviolet-light curing process in a vacuum, because a vacuum helps to remove volatile substances present in the photo-resist pattern, thereby further hardening the photo-resist pattern against the etching process. Thus, this additional ultraviolet curing process available with the vacuum plasma etching device of the present invention eliminates the need for additional devices in which to perform the curing process, and eliminates the manufacturing time associated with loading, unloading, and transferring pre-process wafers 18 between devices.

Although the above-described preferred embodiment of the present invention involves selectively exposing the photo-resist pattern to ultraviolet light, it should be understood that other sources of radiation may be employed to irradiate the photo-resist pattern. In such instances, cover 51 would, of course, be adapted to allow such radiation to impinge upon the photo-resist pattern. In addition, although the predetermined loadlock idle period would not change, the selected exposure periods for other forms of radiation may vary.

It will be apparent that the present invention may be implemented by converting an existing vacuum plasma etching device, such as device 11, by either replacing entrance loadlock 17 with improved vacuum loadlock 61, or by simply replacing cover 51 with cover 63 and the associated components described above. In addition, it should be apparent from the foregoing that an invention having significant advantages has been provided. While the invention is shown in only one of its forms, and has been particularly shown and described with reference to a preferred embodiment, it will be understood by those skilled in the art that various changes in form and detail may be made therein without departing from the spirit and scope of the invention.

What is claimed is:

1. A vacuum plasma etching device for plasma etching a semiconductor wafer having a photo-resist pattern, comprising:
   at least one vacuum loadlock loading the semiconductor wafer into the vacuum plasma etching device;
   a source of ultraviolet radiation selectively irradiating the photo-resist pattern with incident radiation while the semiconductor wafer is held within the at least one vacuum loadlock.

2. The vacuum plasma etching device according to claim 1, wherein the source of radiation is a source of ultraviolet light located outside the at least one vacuum loadlock, and the incident radiation is ultraviolet light.

3. The vacuum plasma etching device according to claim 1,
   wherein the semiconductor wafer is held in a vacuum within the at least one vacuum loadlock for a predetermined loadlock idle period, and
   wherein the photo-resist pattern is selectively irradiated for a selected exposure period, the selected exposure period being equal to or less than the predetermined loadlock idle period.

4. The vacuum plasma etching device according to claim 3, wherein the selected exposure period is less than about 60 seconds.

5. A vacuum plasma etching device for plasma etching a semiconductor wafer having a photo-resist pattern, comprising:
   a vacuum reaction chamber for performing plasma etching;
   at least one vacuum loadlock in communication with the vacuum reaction chamber, the at least one vacuum loadlock being adapted to transition from a vacuum to a non-vacuum and vice-versa and for loading the semiconductor wafer into the vacuum reaction chamber;
   a vacuum pump means for selectively creating and maintaining a vacuum within the vacuum reaction change and the at least one vacuum loadlock;
   a control system for controlling an operation of the vacuum plasma etching device; and
   a source of ultraviolet light for selectively irradiating the photo-resist pattern with ultraviolet light while the semiconductor wafer is held within the at least one vacuum loadlock.

6. The vacuum plasma etching device according to claim 5, wherein the at least one vacuum loadlock is adapted to hold the semiconductor wafer such that the photo-resist pattern is selectively exposed to the ultraviolet light.

7. The vacuum plasma etching device according to claim 6, wherein the at least one vacuum loadlock is further adapted to hold the semiconductor wafer such that the photo-resist pattern is selectively exposed to the ultraviolet light while in a vacuum.

8. The vacuum plasma etching device according to claim 5, wherein the at least one vacuum loadlock comprises:
   a vacuum-sealable housing;
   an actuating member for transporting and holding the semiconductor wafer into and out of the at least one vacuum loadlock, the actuating member being at least partially disposed within the at least on vacuum loadlock;
   at least one opening in the vacuum-sealable housing through which the actuating member transports the semiconductor wafer,
   wherein the vacuum-sealable housing has an ultraviolet light-transparent portion through which the ultraviolet light from the ultraviolet light source passes to impinge upon the photo-resist pattern.

9. The vacuum plasma etching device according to claim 8, wherein the ultraviolet light-transparent portion is a window in a top cover sealingly coupled to the vacuum-sealable housing.

10. The vacuum plasma etching device according to claim 8, wherein the ultraviolet light-transparent portion is a top cover sealingly coupled to the vacuum-sealable housing.

11. The vacuum plasma etching device according to claim 8, wherein the ultraviolet light-transparent portion is made of quartz.

12. The vacuum plasma etching device according to claim 8, wherein the ultraviolet light-transparent portion is made of sapphire.

13. The vacuum plasma etching device according to claim 5, wherein the source of ultraviolet light comprises:
   a lamp housing coupled to the at least one vacuum loadlock; and
   at least one ultraviolet lamp carried by the lamp housing.

14. The vacuum plasma etching device according to claim 13, wherein the source of ultraviolet light comprises:
   an arrangement of optical lenses for focusing and intensifying the impingement of the ultraviolet light upon the photo-resist pattern.

15. A vacuum loadlock for use in a vacuum plasma etching device for etching a semiconductor wafer having a photo-resist pattern defining where a plasma will etch the semiconductor wafer, comprising:
   a housing having a bottom portion, a plurality of side portions, and an initially open top portion;
   a plurality of openings in the side portions, the plurality of openings being configured to allow the semiconductor wafer to pass therethrough to be loaded into the vacuum plasma etching device;
   a plurality of sealing means for releasably vacuum-sealing the plurality of openings;
   an actuating means for moving the semiconductor wafer through the plurality of openings, and for locating the semiconductor wafer within the housing;

a vacuum pump means for selectively creating and maintaining a vacuum within the housing;

a cover member for sealingly closing the initially open top portion, the cover member having an ultraviolet light-transparent portion;

a source of ultraviolet light for generating ultraviolet light, the source of ultraviolet light being coupled to the cover member such that the ultraviolet light passes through the ultraviolet light-transparent portion and impinges upon the photo-resist pattern; and a control system for controlling the sealing means, the actuating means, the vacuum pump means, and the source of ultraviolet light.

16. The vacuum loadlock according to claim 15, wherein the ultraviolet light-transparent portion is made of quartz.

17. The vacuum loadlock according to claim 15, wherein the ultraviolet light-transparent portion is made of sapphire.

18. The vacuum loadlock according to claim 15, wherein the ultraviolet light-transparent portion is circular in shape and located within the cover member such that the ultraviolet light-transparent portion is concentric with the semiconductor wafer.

19. The vacuum loadlock according to claim 15, wherein the ultraviolet light cures the photo-resist pattern.

* * * * *